(12) United States Patent
Kiehlbauch

(10) Patent No.: US 8,910,591 B2
(45) Date of Patent: Dec. 16, 2014

(54) APPARATUS AND METHODS FOR CAPACITIVELY COUPLED PLASMA VAPOR PROCESSING OF SEMICONDUCTOR WAFERS

(71) Applicant: Micron Technology, Inc., Boise, ID (US)

(72) Inventor: Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/767,526

(22) Filed: Feb. 14, 2013

(65) Prior Publication Data

US 2013/0154479 A1  Jun. 20, 2013

Related U.S. Application Data

(62) Division of application No. 11/688,144, filed on Mar. 19, 2007, now Pat. No. 8,375,890.

(51) Int. Cl.

| H01L 21/00 | (2006.01) |
|---|---|
| C23C 16/00 | (2006.01) |
| H01J 1/13 | (2006.01) |
| H01J 37/32 | (2006.01) |
| H01L 21/67 | (2006.01) |

(52) U.S. Cl.
CPC ............ *H01J 1/135* (2013.01); *H01J 37/32724* (2013.01); *H01J 37/32091* (2013.01); *H01L 21/67109* (2013.01); *H01L 21/67069* (2013.01)
USPC ................................. 118/723 E; 156/345.47

(58) Field of Classification Search
USPC ......................... 427/569; 438/710; 118/723 E; 156/345.43, 345.44, 345.45, 345.46, 156/345.47, 345.27
See application file for complete search history.

(56) References Cited

U.S. PATENT DOCUMENTS

| 4,963,713 A | 10/1990 | Horiuchi et al. |
|---|---|---|
| 5,227,000 A | 7/1993 | Kobayashi et al. |
| 5,599,396 A | 2/1997 | Sandhu |
| 5,667,622 A | 9/1997 | Hasegawa et al. |
| 5,766,364 A | 6/1998 | Ishida et al. |
| 6,035,868 A | 3/2000 | Kennedy et al. |
| 6,073,577 A | 6/2000 | Lilleland et al. |
| 6,189,484 B1 | 2/2001 | Yin et al. |
| 6,245,192 B1 | 6/2001 | Dhindsa et al. |
| 6,347,602 B2 | 2/2002 | Goto et al. |
| 6,563,076 B1 | 5/2003 | Benjamin et al. |

(Continued)

FOREIGN PATENT DOCUMENTS

| JP | 61238985 A | 10/1986 |
|---|---|---|
| JP | 2006352040 A | 12/2006 |

*Primary Examiner* — Sylvia R MacArthur
*Assistant Examiner* — Anna Crowell
(74) *Attorney, Agent, or Firm* — Perkins Coie LLP

(57) ABSTRACT

A capacitively coupled plasma reactor comprising a processing chamber, a first electrode, a second electrode and a thermoelectric unit. The processing chamber has an upper portion with a gas inlet and a lower portion, and the upper portion is in fluid communication with the lower portion. The first electrode has a front side and a backside and is positioned at the upper portion of the processing chamber. The second electrode is positioned in the lower portion of the processing chamber and is spaced apart from the front side of the first electrode. The thermoelectric unit is positioned proximate to the backside of the first electrode and is capable of heating and cooling the first electrode.

28 Claims, 8 Drawing Sheets

(56) References Cited

U.S. PATENT DOCUMENTS

| | | |
|---|---|---|
| 6,786,175 B2 | 9/2004 | Dhindsa et al. |
| 6,853,141 B2 | 2/2005 | Hoffman et al. |
| 6,921,724 B2 | 7/2005 | Kamp et al. |
| 6,972,524 B1 | 12/2005 | Marakhtanov et al. |
| 7,029,536 B2 | 4/2006 | Hamelin et al. |
| 7,094,315 B2 | 8/2006 | Chen et al. |
| 7,140,374 B2 | 11/2006 | Bailey, III et al. |
| 7,661,386 B2 | 2/2010 | Kasai et al. |
| 2001/0047762 A1 | 12/2001 | Hayashi |
| 2002/0159216 A1* | 10/2002 | Ennis .......................... 361/234 |
| 2003/0047282 A1 | 3/2003 | Sago et al. |
| 2004/0011770 A1 | 1/2004 | Strang et al. |
| 2004/0195207 A1 | 10/2004 | Tanaka |
| 2005/0039682 A1 | 2/2005 | Dhindsa et al. |
| 2005/0087302 A1 | 4/2005 | Mardian et al. |
| 2005/0133160 A1 | 6/2005 | Kennedy et al. |
| 2005/0241766 A1 | 11/2005 | Dhindsa et al. |
| 2006/0137820 A1 | 6/2006 | Lee et al. |
| 2006/0213763 A1* | 9/2006 | Furuya et al. .............. 204/192.1 |
| 2007/0022954 A1 | 2/2007 | Iizuka et al. |
| 2007/0084563 A1 | 4/2007 | Holland |
| 2008/0230377 A1 | 9/2008 | Kiehlbauch |

* cited by examiner

APPARATUS AND METHODS FOR CAPACITIVELY COUPLED PLASMA VAPOR PROCESSING OF SEMICONDUCTOR WAFERS

CROSS-REFERENCE TO RELATED APPLICATION

This application is a divisional of U.S. application Ser. No. 11/688,144 filed Mar. 19, 2007, now U.S. Pat. No. 8,375,890, which is incorporated herein by reference.

TECHNICAL FIELD

The present invention relates to processing semiconductor wafers in a capacitively coupled plasma reaction chamber.

BACKGROUND

Thin film deposition and etching techniques are used in semiconductor wafer processing to build interconnects, plugs, gates, capacitors, transistors or other microfeatures. Thin film deposition and etching techniques are continually improving to meet the ever increasing demands of the industry as the sizes of microfeatures decrease and the number of microfeatures increases. As a result, the density of the microfeatures and aspect ratios of depressions (e.g., the ratio of the depth to the size of the opening) are increasing. Thin film techniques accordingly strive to consistently produce highly accurate processing results. Many etching and deposition processes, for example, seek to form uniform layers or other layers that uniformly cover sidewalls, bottoms and corners in deep depressions that have very small openings.

CCP processes are often challenging because the characteristics of the plasma generated in the reaction chamber as well as the deposition or etching results depend on the electrode temperature, but it is difficult to quickly control the temperature of the first or upper electrode within a small range. For example, in conventional CCP chambers a thermal control unit controls the first electrode temperature, however typical thermal control units have large time constants and do not accurately maintain a set or constant temperature due to heat changes during processing (e.g., when the electrodes are biased on and off to form the plasma). Another problem associated with thermal control of the first electrode is that inconsistent electrode temperatures can produce inconsistent processing results. For example, with a fluorocarbon plasma, the amount of fluorocarbon polymer that is attracted to the first electrode, and therefore away from the wafer, is inversely proportional to the temperature of the first electrode. Conventional CCP chambers, however, have separate heating and cooling elements that increase the thermal impedance of the upper portion 4. Accordingly, conventional CCP reactors are subject to inconsistent starting temperatures and thermal fluctuations of the first electrode during plasma generation that can result in variability in the processing results.

Another problem associated with the thermal control of the first electrode is differential thermal expansion between hardware proximate to the upper electrode. The different components of the upper portion have different coefficients of thermal expansion, which can cause rubbing and stress during temperature cycling. This rubbing may produce particles that are conveyed by the process gas stream to the semiconductor wafer forming defects on the semiconductor wafer. Such non-uniformities and defects limit the utility of CCP vapor processing for forming very small microfeatures. Accordingly, a need exists for improved thermal control of the electrode and thermal management of the upper portion for consistent processing results in a CCP reactor.

DETAILED DESCRIPTION

Several embodiments of the present invention are directed toward semiconductor wafer processing systems and methods for depositing or etching materials on semiconductor wafers. Many specific details of the invention are described below with reference to systems for depositing or etching materials on semiconductor wafers with capacitively coupled plasma (CCP) in chemical vapor processes. The term "semiconductor wafer" is used throughout to include substrates upon which and/or in which microelectronic devices, micromechanical devices, data storage elements, read/write components and other features are fabricated. For example, semiconductor wafers can be silicon or gallium arsenide wafers, glass substrates, insulative substrates and substrates made from many other types of materials. The semiconductor wafers typically have submicron features and components with dimensions of a few nanometers or greater. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 2-7B and the following text to provide a thorough understanding of particular embodiments of the invention. Moreover, several other embodiments of the invention can have different configurations, components or procedures than those described in this section. A person skilled in the art will understand, therefore, that the invention may have additional embodiments, or that the invention may be practiced without several details of the embodiments shown in FIGS. 2-7B.

Figure 1:
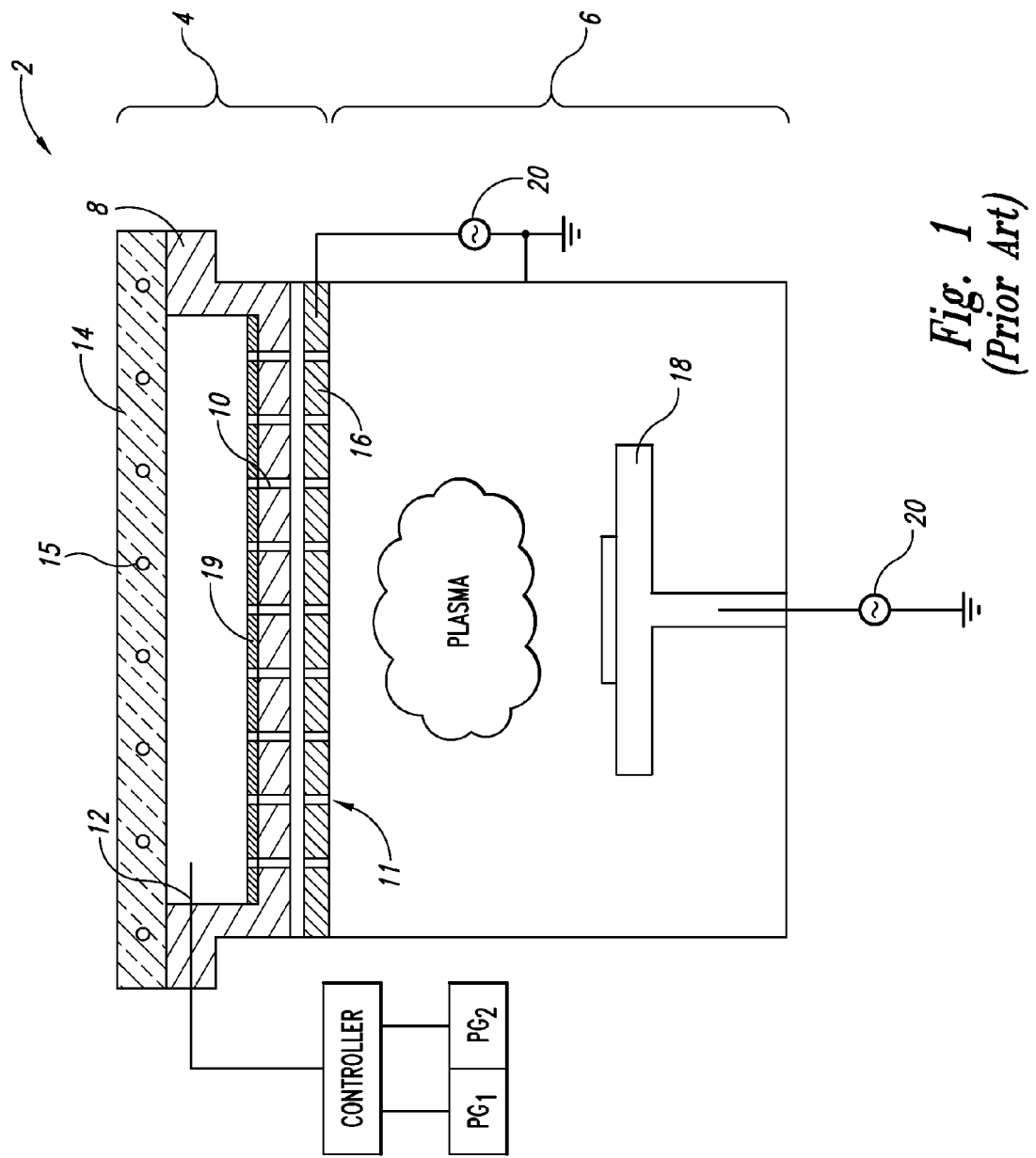
FIG. 1 is a schematic cross-sectional view of a plasma etch or deposition processing system in accordance with the prior art.
Figure 2:
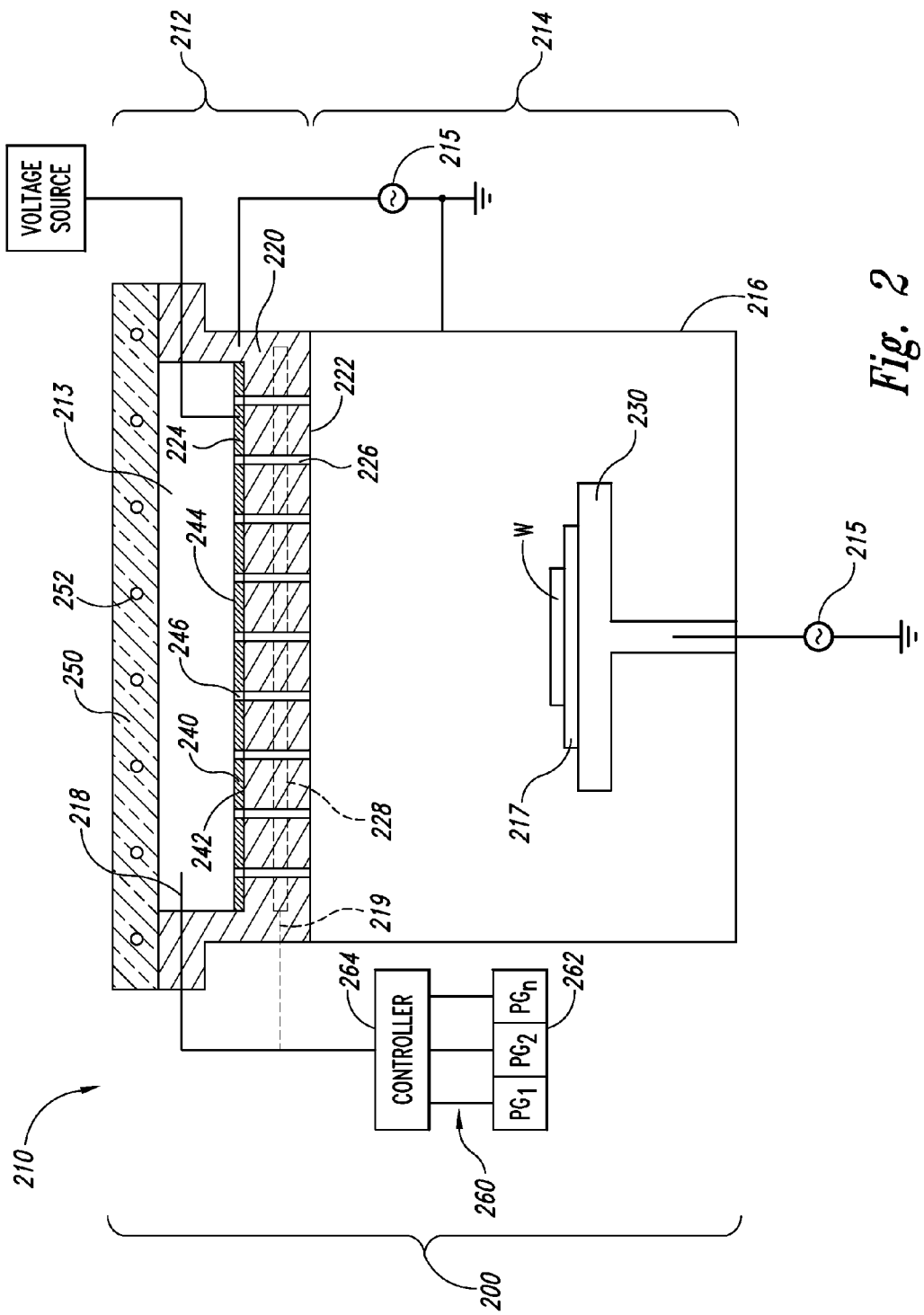
FIG. 2 is a schematic cross-sectional view of a plasma etch or deposition processing system in accordance with an embodiment of the invention.

FIG. 2 is a schematic cross-sectional view of a plasma vapor processing system 200 for depositing or etching material on a semiconductor wafer W. In this embodiment, the processing system 200 includes a reactor 210 having an upper portion 212 and a lower portion 214. The upper portion 212 includes a gas inlet 218, and gases can flow from the upper portion 212 to the lower portion 214. The lower portion 214 includes a processing chamber 216. The processing chamber 216 can be a low pressure chamber capable of producing and sustaining a low pressure environment. For example, the processing chamber 216 can be coupled to a vacuum pump (not shown) to reduce and maintain the pressure in the processing chamber 216. The reactor 210 further includes a first electrode 220 at the upper portion 212 and a second electrode 230 in the lower portion 214. The first electrode 220 has a front side 222 facing the processing chamber and a backside 224 opposite the front side 222. The second electrode 230 is spaced apart from the front side 222 of the first electrode 220. The first and second electrodes 220 and 230 are connected to an RF power supply 215 and a ground, such that in operation one of the first or second electrodes 220 or 230 is biased by the RF power supply 215 while the other electrode is grounded. In other embodiments, both of the first and second electrodes 220 and 230 are biased by the RF power supply and a sidewall of the chamber 216 is grounded. The reactor 210 further includes a thermoelectric unit 240 positioned at least proximate to the backside 224 of the first electrode 220 and configured to heat and/or cool the first electrode 220 during one or more processing procedures.

The upper portion 212 includes an antechamber 213 for receiving a small volume of one or more process gases via the gas inlet 218. The gases, for example, can flow into the antechamber 213 at a constant pressure for equal mixing to provide an even flow from the upper portion 212 to the lower portion 214. The first electrode 220 includes one or more channels or outlets 226 through which the gases flow from the upper portion 212 to the lower portion 214. In one embodiment, the first electrode 220 functions as a gas distributor between the upper portion 212 and the lower portion 214. For example, the outlets 226 in the first electrode 220 can be sized and arranged to distribute the one or more process gases into the lower portion 214. The outlets 226 can be generally arranged relative to a wafer W positioned in the processing chamber 216 to provide a controlled distribution of the one or more process gases onto the wafer W.

In certain embodiments, a gas inlet 219 can introduce the one or more process gases into the first electrode 220. For example, as shown by broken lines in FIG. 2, the first electrode 220 can include an inner chamber 228 and the gas inlet 219 can introduce the one or more process gases directly into the inner chamber 228 of the first electrode 220 instead of the antechamber 213 in the upper portion 212. The one or more process gases can accordingly flow through the first electrode 220 and into the processing chamber 216 of the lower portion 214.

The thermoelectric unit 240 includes a first surface 242 and a second surface 244 opposite the first surface 242. The first surface 242 of the thermoelectric unit 220 is positioned proximate to the backside 224 of the first electrode 220. In specific embodiments, the thermoelectric unit 240 heats and/or cools the first electrode 220 by direct conduction. For example, the first surface 242 of the thermoelectric unit can directly contact the backside 224 of the first electrode 220 to directly conduct heat away from or to the first electrode 220. The thermoelectric unit 240 may also include one or more ports or outlets 246 to allow the one or more process gases to pass through the thermoelectric unit 240 and out of the upper portion 212. For example, the thermoelectric unit 240 can include a larger or smaller number of outlets 246, or the same number of outlets 246 as the number of outlets 226 of the first electrode 220. In some embodiments, a pattern of the outlets 246 of the thermoelectric unit 240 may coincide or match a pattern of the outlets 226 of the first electrode 220. Alternatively, the pattern of the outlets 246 may differ from the pattern of the outlets 226 of the first electrode 220, according to the deposition or etching needs of the process.

The thermoelectric unit 240 can be a Peltier heating and cooling unit. For example, when the thermoelectric unit 240 is connected to a voltage source the first surface 242 of the thermoelectric unit 240 absorbs heat while the second surface 244 of the thermoelectric unit 240 emits heat. If the polarity of the voltage is reversed, the first surface 242 of the thermoelectric unit 240 emits heat while the second surface 244 of the thermoelectric unit 240 absorbs heat. Accordingly, the thermoelectric unit 240 provides heating and cooling at the same location and can rapidly switch between heating and cooling modes.

In the embodiment shown in FIG. 2, the upper portion also has a thermal control unit or plate 250 enclosing the antechamber 213. The second surface 244 of the thermoelectric unit 240 is positioned proximate to the plate 250. The second surface 244 is generally spaced apart from the plate 250 to provide space for the antechamber 213, but portions of the plate 250 and the second surface 244 may contact each other for better heat transfer. However in some embodiments, the plate 250 contacts the entire second surface 244. The plate 250 includes a plurality of channels 252 for flowing a cooling or heating medium through the plate 250 to cool or heat the thermoelectric unit 240 and the upper portion 212. For example, water can flow through the plate 250 to add heat or remove heat from the second surface 244 of the thermoelectric unit 240 depending on the relative temperatures of the thermoelectric unit 240 and the plate 250. The water can be heated or cooled before flowing through the plate 250, or the water can be maintained approximately at room temperature (e.g., 18-27° C.) before and/or while flowing through the plate 250.

The processing system can further include a gas supply 260 having one or more process gases and a controller 264 operatively coupled to the gas supply 260. The gas supply 260 can include a one or more process gases $PG_1$, $PG_2$, ..., $PG_n$ suitable for processing a semiconductor wafer W. The gas supply 260 flows the one or more process gases $PG_1$, $PG_2$, ..., $PG_n$ through the gas inlet 218 into the upper portion 212, or in alternative embodiments through the gas inlet 219 into the first electrode 220. Accordingly, the reactor 210 can receive one or more process gases that are selectively delivered to the upper portion 212 or the first electrode 220 according to computer operable instructions contained in the controller 264.

The lower portion 214 of the reactor 210 includes a wafer holder 217 positioned in the processing chamber 216 at least proximate to the second electrode 230. The wafer holder 217 can be a component of the second electrode 230, or the wafer holder 217 can be a separate nonconductive component. The wafer holder 217 can also be a heated chuck or other device that holds the workpiece W during the processing.

The plasma vapor processing system 200 can provide rapid, accurate and consistent thermal control of the first electrode 220 during semiconductor wafer processing. In operation, the first electrode 220 and the second electrode 230 create an energy field to ionize the one or more process gases and form a plasma in the processing chamber 216 of the lower portion 214. To begin processing, the thermoelectric unit 240 heats the first electrode 220 to a desired starting temperature. For example, the starting temperature of the first electrode 220 may be approximately 170° C. in a specific application. When the first electrode reaches the desired starting temperature, the controller 264 flows one or more process gases into the upper portion 212 of the reactor 210. As the one or more process gases flow from the upper portion 212 to the processing chamber 216 of the lower portion 214, one of the first or second electrodes 220 or 230 is biased with the RF power supply 215 while the other electrode is grounded. Alternatively, both of the first and second electrodes are biased by the RF power supply 215 while a sidewall of the chamber 216 is grounded. The first and second electrodes 220 and 230 create an energy field that ionizes the one or more process gases to form the plasma in the processing chamber 216. The plasma generated in the reactor 210 affects the temperature of the first electrode 220. For example, the plasma generation portion of a processing cycle can increase the temperature of the first electrode by a significant amount (e.g., about 20° C.). To counteract the heat generated by the plasma, the thermoelectric unit 240 can be used to cool the first electrode 220 during this portion of the process to reduce the temperature increase of the first electrode 220. Moreover, in embodiments where the thermoelectric unit 240 is a Peltier heating and cooling unit, the thermoelectric unit 240 can rapidly respond to heat or cool the first electrode 220 to maintain a generally constant temperature. After completing the process, the electrodes 220 and 230 are de-energized and the gas flow is stopped. The first electrode 220 will then begin to cool and the thermoelectric unit 240 can be activated to heat the first electrode 220 when the temperature falls below the desired level.

Several embodiments of the reactor 210 can provide good control of the first electrode temperature because the thermoelectric unit 240 can both heat or cool at the backside of the first electrode. More specifically, depending on the polarity of the voltage applied to the thermoelectric unit 240, the first surface 242 positioned proximate to the backside 224 of the first electrode 220 will either heat or cool the first electrode 220. When the first surface 242 heats the first electrode 220, the second surface 244 of the thermoelectric unit 240 will cool the upper portion 212 of the reactor 210. Accordingly, heat can be added to the second surface 244 to maintain thermal control and prevent excessive cooling of the hardware of the upper portion 212. For example, when the first surface 242 is heating the first electrode 220 and the second surface 244 is cooling the upper portion 212, the second surface 244 may cause condensation in the upper portion 212 if a sufficient amount of heat is not added to the second surface 244. Alternatively, when the first surface 242 is cooling the first electrode 220, the second surface 244 of the thermoelectric unit 240 will heat the upper portion 212. Accordingly, heat can be removed from the second surface 244 to maintain thermal control and prevent excessive heating or expansion of the hardware in the upper portion 212. The plate 250 positioned proximate to the second surface 244 of the thermoelectric unit 240 can act as a heat source or sink to the second surface 244. For example, flowing water through the channels 252 of the plate 250 can provide sufficient thermal control of the back surface 244 of the thermoelectric unit 240 to at least partially avoid the problems associated with excessive cooling or heating of the upper portion 212. As a result, the primary heating and cooling of the first electrode 220 can both be performed at or near the first electrode 220. Several embodiments can accordingly provide rapid and accurate control of the first electrode temperature.

Positioning the thermoelectric unit 240 proximate to the first electrode 220 in the upper portion 212 can further provide accurate and consistent thermal control of the first electrode 220 and improved thermal management of the upper portion 212. For example, the first surface 242 of the thermoelectric unit 240 can rapidly switch between heating and cooling modes by changing the polarity of the voltage applied to the thermoelectric unit 240. This rapid and dynamic control of the thermoelectric unit 240 increases the accuracy and consistency of the temperature of the first electrode 220 before and during semiconductor wafer processing. Accordingly, the improved thermal control of the first electrode 220 can improve the characteristics of the plasma and the processing results on the wafer W.

In addition, positioning the thermoelectric unit 240 proximate to or in contact with the first electrode 220 can improve the thermal conductivity between the first electrode 220 and the thermoelectric unit 240 for both heating and cooling modes. An improved thermal conductivity can produce a reduced temperature gradient across the upper portion 212 for a constant amount of transferred heat. For example, according to Fourier's law, $Q=-k_{eff} \times \nabla T$, where Q is the rate of heat transfer, k is the lumped average thermal conductivity of the materials of the system, and $\nabla T$ is the temperature gradient, for a constant rate of heat transfer Q, the thermal conductivity k is inversely proportional to the temperature gradient $\nabla T$. Accordingly, improving the thermal conductivity to transfer heat to or away from the backside 224 of the first electrode 220 by positioning the thermoelectric unit 240 proximate to or in contact with the first electrode 220 can create a reduced temperature gradient across the hardware of the upper portion 212, while transferring the same amount of heat from the upper portion 212.

The reduced temperature gradient across the upper portion 212 can also decrease the differential thermal expansion (DTE) of the different materials in the upper portion 212. With reduced DTE, the hardware proximate to the first electrode 220 will expand and contract less resulting in less rubbing and stressing. This may reduce the number of particles generated at or near the first electrode 220. Accordingly, the reduced DTE can decrease the number of particles deposited on the wafer W which in turn can reduce the number of defects on the wafer W during processing.

In addition, the thermoelectric unit 240 can provide simplified thermal control of the upper portion 212 while maintaining accurate and consistent thermal control of the first electrode 220. As noted above, while the first surface 242 of the thermoelectric unit heats the first electrode 220, the second surface 244 cools the upper portion 212, and vice versa. The first surface 242 dominates the heat transfer at the first electrode 220. The thermal control of the second surface 244 can accordingly be relaxed because of the large range of allowable temperature differential between the first and second surfaces 242 and 244. For example, the first surface 242 of the thermoelectric unit 240 can be at a fixed temperature proximate to the backside 224 of the first electrode 220 while the temperature of the second surface 244 can vary because the second surface 244 is spaced apart from the backside 224 of the first electrode 220. In a specific embodiment, the fixed temperature at the first surface 242 can be 100° C. and the second surface can vary between temperatures of 20° C. to 180° C. In additional embodiments, multiple thermoelectric units 240 can be stacked to provide a multi-stage thermoelectric unit, which is capable of providing a temperature difference of approximately 120° C. between the first and second surfaces of the stacked thermoelectric unit. Accordingly, the thermoelectric unit can create an allowable temperature range between the first surface 242 and the second surface 244, while still maintaining accurate thermal control of the first surface 242 positioned proximate to or contacting the backside 224 of the first electrode 220. Therefore, cooling or heating water flowing through the plate 250 can be a heat sink or source to the second surface 244 of the thermoelectric unit 240. For example, a flow of room temperature water will likely suffice to both heat and cool the second surface 244 of the thermoelectric unit 240 as the second surface 244 may not require strict temperature control. Using room temperature water as the cooling and/or heating fluid in the plate 250 can considerably simplify the deign of the upper portion 212 of the reactor 210. As a result, several embodiments of the reactor 210 can simplify the thermal control of the upper portion 212.

Figure 3A:
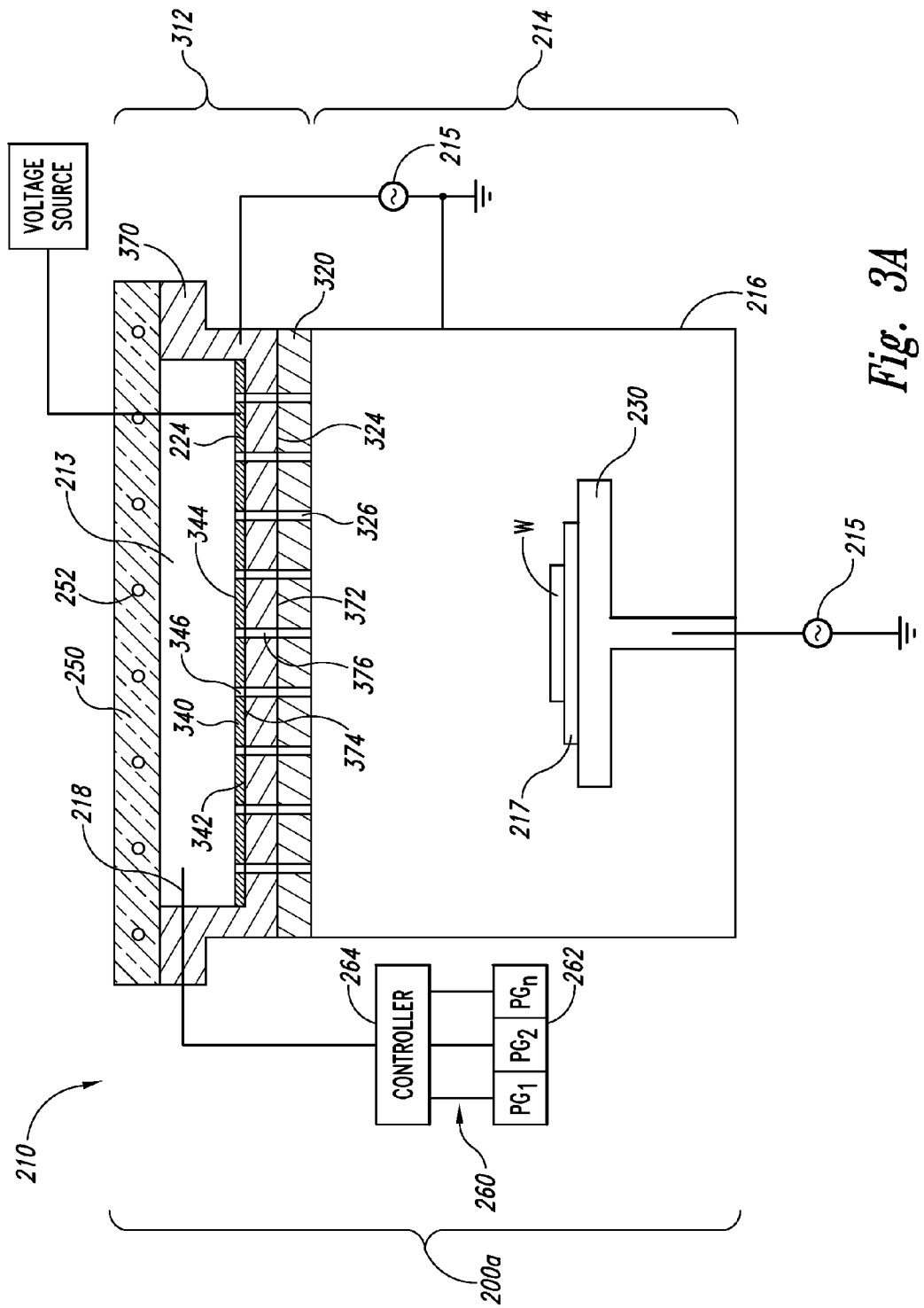
FIGS. 3A, 3B, and 3C are schematic cross-sectional views of plasma etch or deposition processing systems in accordance with embodiments of the invention.
Figure 3B:
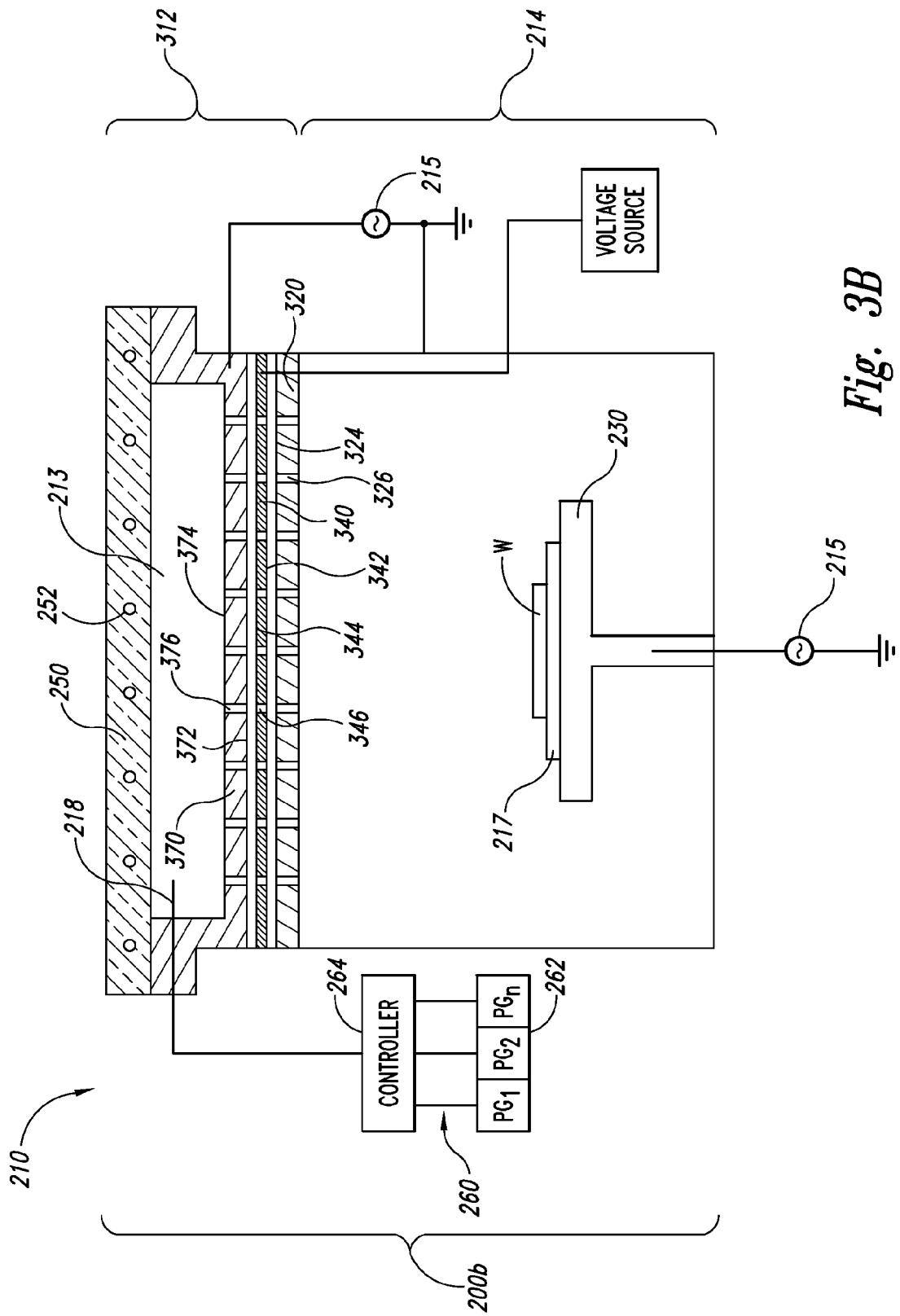
Figure 3C:
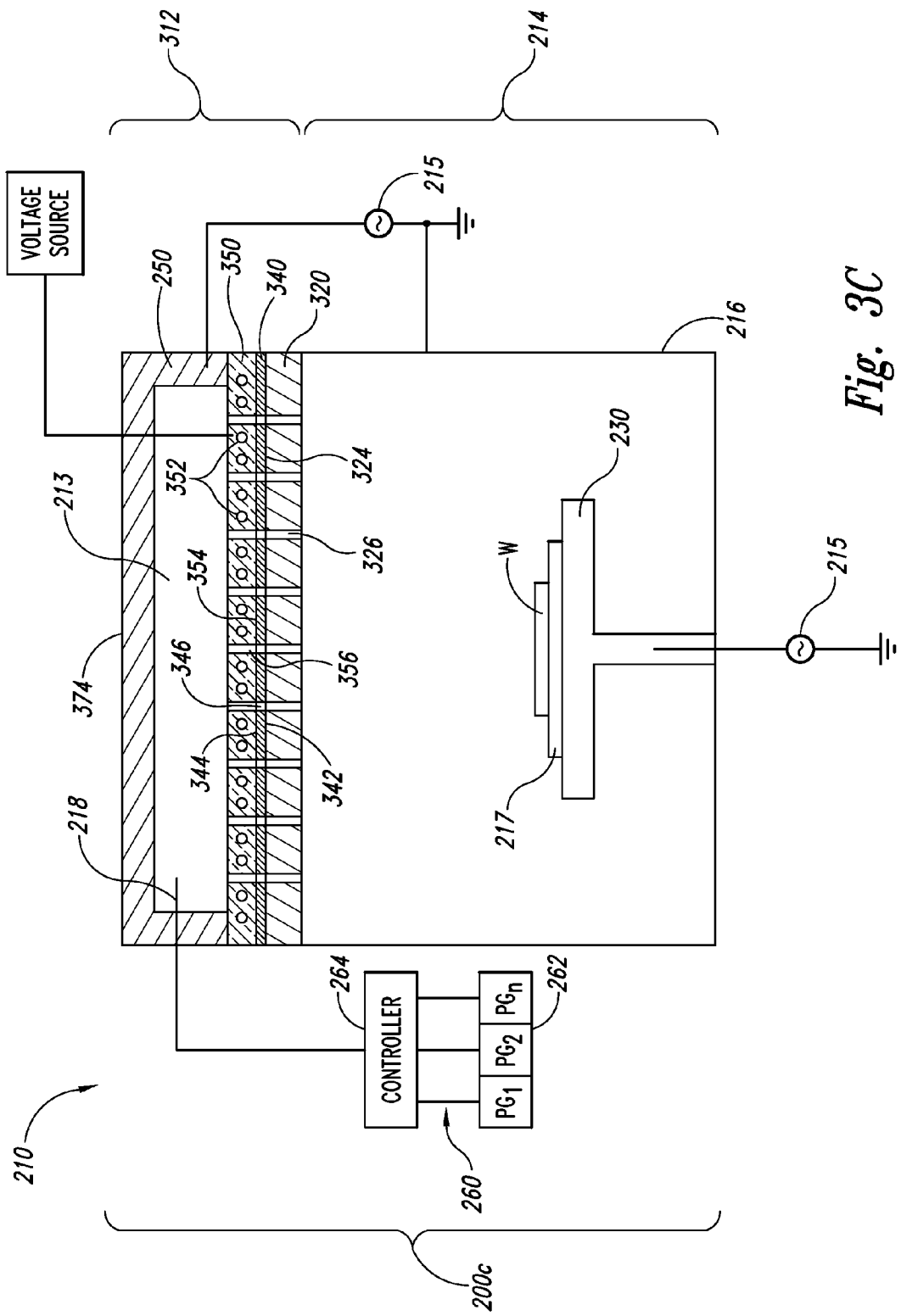

FIGS. 3A-C are schematic cross-sectional views of embodiments of plasma vapor processing systems 200a-c. Like reference numbers refer to like components in FIGS. 2, and 3A-C, and thus the description of such components will not be repeated with reference to the processing systems 200a-c. The difference between the processing system 200 shown in FIG. 2 and the processing system 200a shown in FIG. 3A is that the processing system 200a has an upper portion 312 having a gas distributor 370 positioned between a first electrode 320 and a thermoelectric unit 340. The gas distributor 370 has a front side 372 and a backside 374. The front side 372 of the gas distributor 370 is positioned proximate to a backside 324 of the first electrode 320, and the backside 374 of the gas distributor is positioned proximate to a first surface 342 of the thermoelectric unit 340. In this embodiment, the thermoelectric unit 340 heats or cools the gas distributor 370 and first electrode 320 by conduction. For example, the first surface 342 of the thermoelectric unit 340 can directly contact the backside 374 of the gas distributor 370 and the front side 372 of the gas distributor 370 can directly contact the backside 324 of the first electrode. In other embodiments, the thermoelectric unit 340 can be spaced apart from the gas distributor 370 by a small gap.

The gas distributor 370 includes one or more channels or outlets 376 through which gas can flow from the upper portion 312 to the lower portion 214. For example, the outlets 376 can be sized and arranged to provide desired processing results on the wafer W positioned on the wafer holder 217 in the lower portion 214. In addition, the gas distributor 370 may include one or more chambers or plenums within the gas distributor 370. In certain embodiments, the thermoelectric unit 340 may include one or more channels or outlets 346, and the first electrode 320 may also include one or more channels or outlets 326 through which one or more process gasses can flow. The thermoelectric unit 340 and the first electrode 320 can include a larger, smaller or the same number of outlets 346 and 326 as the number of outlets 376 of the distributor 370. A pattern of the outlets 346 and 326 may coincide or match a pattern of the outlets 376, or these patterns may differ according to the processing needs. The processing system 200a can provide similar performance characteristics as the processing system 200 shown in FIG. 2.

Referring to FIG. 3B, the difference between the processing system 200a shown in FIG. 3A and the processing system 200b shown in FIG. 3B is that the thermoelectric unit 340 is positioned between the first electrode 320 and the gas distributor 370. For example, the first surface 342 of the thermoelectric unit 340 is positioned proximate to the backside 324 of the first electrode 320, and the second surface 344 of the thermoelectric unit 340 is positioned proximate to the front side 372 of the gas distributor 370. In the embodiment shown in FIG. 3B, the thermoelectric unit 340 is spaced apart from both the first electrode 320 and the gas distributor 370. In other embodiments, however, the thermoelectric unit 340 can directly contact one or both of the first electrode 320 and the gas distributor 370. The outlets 326, 346 and 376 are similar to the outlets described with reference to FIG. 3A, and the processing system can provide similar performance characteristics as the processing system 200 shown in FIG. 2 and the processing system 200a shown in FIG. 3A.

Referring to FIG. 3C, the difference between the processing system 200a shown in FIG. 3A and the processing system 200c shown in FIG. 3C is that a thermo control unit or plate 350 is positioned in contact with the thermoelectric unit 340. The plate 350 includes a first surface 354 that contacts the second surface 344 of the thermoelectric unit 340. The plate 350 also includes a plurality of channels 352, similar to the channels 252 described above, for flowing a cooling or heating medium through the plate 350 to cool or heat the thermoelectric unit 340 and the upper portion 312. The plate 350 also includes a plurality of outlets 356 similar to the outlets described above. The illustrated embodiment of FIG. 3C improves contact between the thermoelectric unit 340 and the thermo control unit or plate 350, thus improving conduction and heat transfer in the upper portion 312.

Figure 4A:
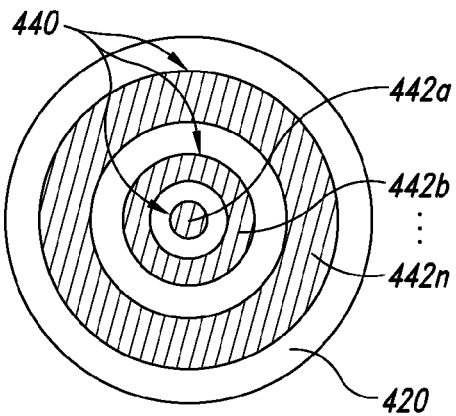
FIG. 4A is a schematic top plan view and FIG. 4B is a schematic cross-sectional view of an electrode and thermoelectric unit in accordance with an embodiment of the invention.
Figure 4B:
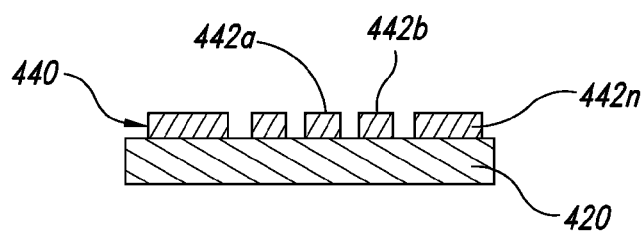

FIG. 4A is a schematic top plan view and FIG. 4B is a schematic cross-sectional view of another embodiment of an electrode 420 and a thermoelectric unit 440. In this embodiment, the thermoelectric unit 440 comprises a plurality of individual independently operable thermoelectric elements 442a, 442b, . . . 442n positioned at least proximate to the first electrode 420. The illustrated embodiment of FIG. 4A has concentric thermoelectric elements 442a-n on the electrode 420. The electrode 420 and thermoelectric unit 440 can also include one or more channels or outlets as described above. The thermoelectric elements 442a-n can differ in width outwardly from the center of the electrode 420 according to different heating needs across the electrode 420. Each thermoelectric element 442a-n, for example, can be an independently operable Peltier device to control the temperature of different regions of the electrode 420 independently. The concentric configuration and the independent operation of the thermoelectric elements 442a-n can provide accurate temperature control of the electrode 420 to better control the deposition or etching process. For example, different factors may cause an uneven temperature distribution across the electrode during processing. These factors may include non-uniformities in the electrode material causing the temperature to vary across the electrode 420. In addition, non-uniform RF coupling of the electrode 420 can vary the temperature in different areas or zones of the electrode 420. For example, non-uniform RF coupling at the periphery of the electrode 420 can make the electrode hotter at the periphery such that deposition and/or etching rate at the edge of the wafer is different than at the center of the wafer. Furthermore, desired processing results may require different temperatures in different zones of the electrode 420. For example, a shaped profile deposition or etch layer may be preferable over a uniform layer. In specific embodiments, such as a seed layer for electroplating or forming layers for chemical mechanical polishing, a dome shaped profile that is thicker at the center compared to the periphery may be desired. Accordingly, the thermoelectric elements 442a-n can be operated independently of each other to dynamically compensate for undesired temperature differences across the electrode 420 or to achieve desired processing results by heating or cooling different zones of the electrode 420 during a process cycle.

Figure 5:
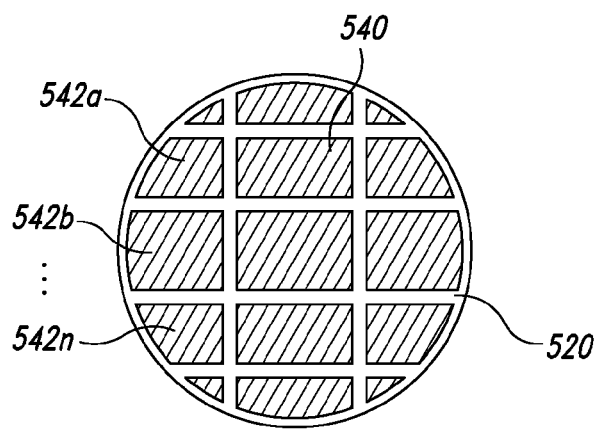
FIG. 5 is a schematic top plan view of an electrode and thermoelectric unit in accordance with an embodiment of the invention.

FIG. 5 is a schematic top plan view illustrating another embodiment of an electrode 520 and thermoelectric unit 540. In this embodiment, the thermoelectric unit 540 has one or more thermoelectric elements 542a, 542b, . . . , 542n. The thermoelectric elements 542a-n can be arranged in a grid-like pattern with respect to the electrode 520, or any other pattern for improving the thermal control of the electrode 520. Accordingly, the thermoelectric elements 542a-n can differ in size, shape and arrangement across the electrode 520. The configuration of the thermoelectric unit 540 of FIG. 5 can provide similar performance characteristics as the configuration shown in FIGS. 4A and 4B.

Figure 6A:
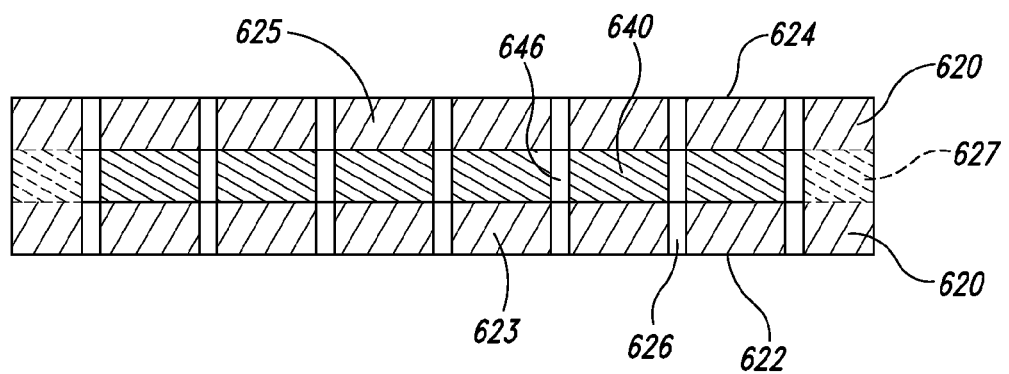
FIGS. 6A and 6B are schematic cross-sectional views of an electrode and thermoelectric unit in accordance with embodiments of the invention.

FIG. 6A is a schematic cross-sectional view of an additional embodiment of an electrode 620 and a thermoelectric unit 640. In this embodiment, the thermoelectric unit 640 is embedded or positioned within the first electrode 620. The first electrode 620 has a front portion 623 with a front side 622, and a back portion 625 with a backside 624. The thermoelectric unit 640 is positioned between the first portion 623 and the second portion 625 of the first electrode 620. The first electrode 620 may have one or more channels or outlets 626, and the thermoelectric unit 640 may also have one or more channels or outlets 646 similar to the outlets 226 and 246 described above. The thermoelectric unit 640 may also extend to a side portion 627 of the first electrode 620 as shown by broken lines in FIG. 6A, or the first electrode 620 may completely contain the thermoelectric unit 640. In some embodiments, the thermoelectric unit 640 may be integral with the first electrode 620. The configuration shown in FIG. 6A can protect the thermoelectric unit during semiconductor processing. For example, the one or more process gases that enter the upper portion of the reactor may be corrosive or aggressive to the materials of the thermoelectric unit 640. Thus, the first electrode 620 can at least partially protect the embedded thermoelectric unit 640 from potentially harmful process gases.

Figure 6B:
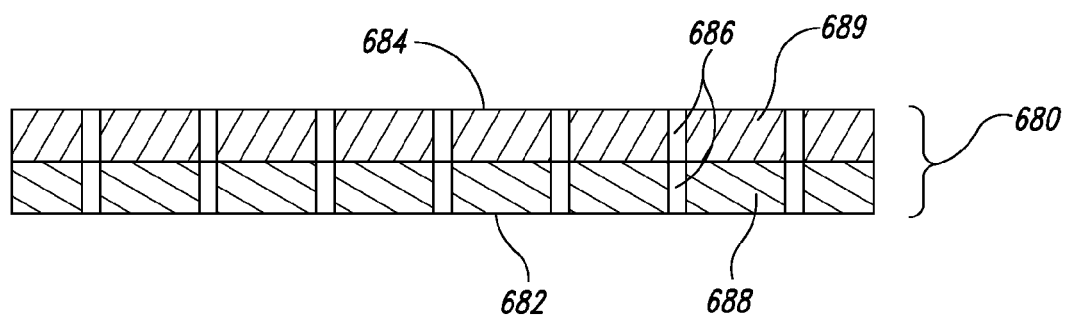

FIG. 6B is a schematic cross-sectional view of a first electrode and thermoelectric unit configuration in accordance with another embodiment of the invention. In this embodiment, a component 680 is both the first electrode and also the thermoelectric unit of the reactor. The component 680 includes a front portion 688 having a front side 682, and a back portion 689 having backside 684. Accordingly, the front side 682 can emit heat while the backside 684 absorbs heat in a forward bias, or the front side 682 can absorb heat while the backside emits heat in a reverse bias. The component 680 can also include one or more channels or outlets 686 similar to the outlets 226 described above. In this configuration, the component 680 can operate similar to the combination of the first electrode and the thermoelectric unit as described above to provide accurate and consistent thermal control of the electrode.

Figure 7A:
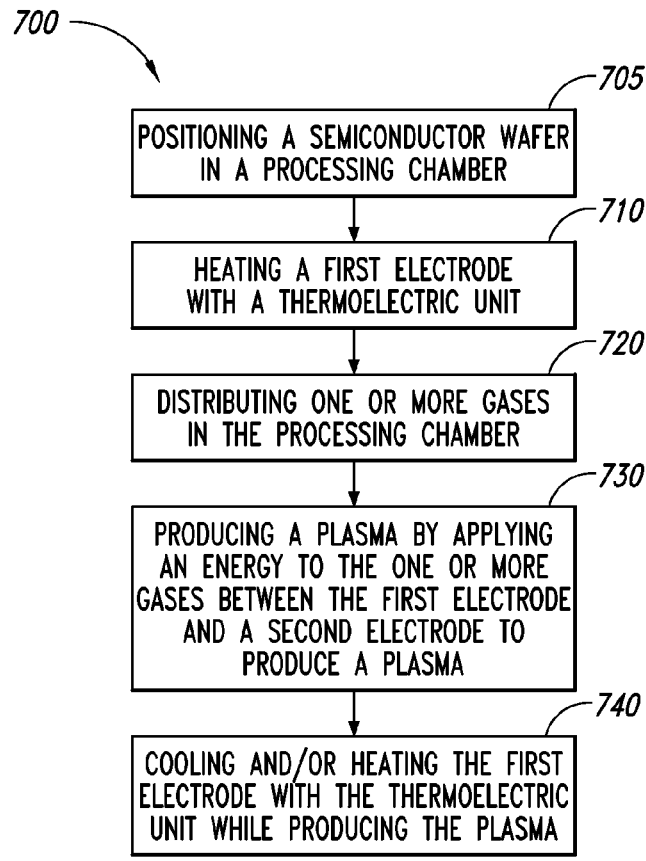
FIGS. 7A and 7B are flow diagrams of processes in accordance with a embodiments of the invention.

FIG. 7A is a flow diagram of an embodiment of a method 700 for processing a semiconductor wafer with capacitively coupled plasma. In this embodiment, the method 700 includes positioning a semiconductor wafer in a processing chamber (block 705) and heating a first electrode with a thermoelectric unit (block 710). The thermoelectric unit can be a Peltier unit, and heating the first electrode can include applying a first voltage having a first polarity to the thermoelectric unit such that a first side of the thermoelectric unit proximate to the first electrode heats the first electrode while a second side of the thermoelectric unit opposite the first side absorbs heat. The thermoelectric unit can also include a plurality of thermoelectric elements that are selectively and independently operable. The process 700 can also include cooling the second side of the thermoelectric unit while the first side of the thermoelectric unit is heating the first electrode. The process 700 further includes distributing one or more gases in the processing chamber (block 720), and producing a plasma by applying an energy to the one or more gasses between the first electrode and a second electrode (block 730). The process 700 also includes cooling and/or heating the first electrode with the thermoelectric unit while producing the plasma (block 740). The process of cooling the first electrode can include applying a second voltage having a second polarity opposite from the first polarity to the thermoelectric unit such that the first side of the thermoelectric unit proximate to the first electrode cools the first electrode. The process 700 can also include heating the second side of the thermoelectric unit while the first side of the thermoelectric unit is cooling the first electrode. In certain embodiments cooling and heating the first electrode can also include monitoring a temperature of the first electrode or regions of the first electrode and operating the thermoelectric unit or thermoelectric elements based on the monitored temperature.

Figure 7B:
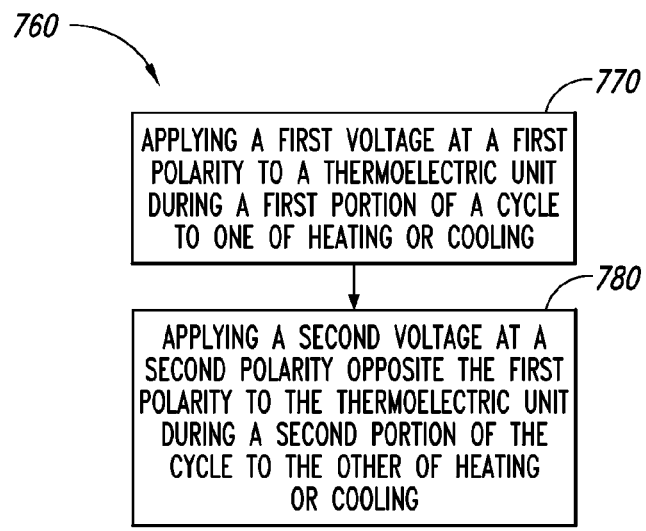

FIG. 7B is a flow diagram of an embodiment of a method 760 for heating and cooling a first electrode in a capacitively coupled plasma reactor. The process 760 can include applying a first voltage at a first polarity to a thermoelectric unit positioned proximate to the first electrode to heat or cool the first electrode (block 770) during a first portion of a cycle. The thermoelectric unit can be a Peltier unit, and the thermoelectric unit can heat the first electrode by conduction. The process 760 also includes applying a second voltage to the thermoelectric unit (block 780). The second voltage has a second polarity opposite the first polarity and is applied to the thermoelectric unit during a second portion of the cycle to the other of heating or cooling. The process 760 can further include heating and/or cooling a back surface of the thermoelectric unit while the thermoelectric unit heats or cools the first electrode.

From the foregoing it will be appreciated that specific embodiments of the invention have been described herein for purposes of illustration, but that various modifications may be made without deviating from the scope of the invention. For example, the elements of one embodiment can be combined with other embodiments in addition to or in lieu of the elements of other embodiments. Accordingly, the invention is not limited except by the appended claims.

I claim:

1. A method of processing a semiconductor wafer with a capacitively coupled plasma in a reactor, the method comprising:
   heating a first electrode disposed in an upper portion of the reactor to a predetermined temperature with a thermoelectric unit having a first side opposite a second side, wherein the first side of the thermoelectric unit is in direct contact with a backside of the first electrode, and wherein the second side of the thermoelectric unit is exposed to the upper portion of the reactor, and;
   producing a plasma in a processing region between the first electrode and a second electrode positioned at least proximate the wafer, and
   cooling the first electrode with the first side of the thermoelectric unit while producing the plasma,
      wherein the thermoelectric unit is configured to selectively heat and cool the first electrode via the first side to maintain a generally constant temperature of the first electrode;
      wherein the second side of the thermoelectric unit is configured to heat the upper portion of the reactor when the first side of the thermoelectric unit cools the first electrode; and
      wherein the second side of the thermoelectric unit is configured to cool the upper portion of the reactor when the first side of the thermoelectric unit heats the first electrode.

2. The method of claim 1 wherein:
   heating the first electrode comprises providing a voltage having a first polarity to the thermoelectric unit such that the first side of the thermoelectric unit heats the first electrode; and cooling the first electrode comprises providing a voltage having a second polarity opposite the first polarity to the thermoelectric unit such that the first side of the thermoelectric unit cools the first electrode.

3. The method of claim 1 wherein the thermoelectric unit heats and cools the first electrode by conduction.

4. The method of claim 1 wherein cooling and heating the second side of the thermoelectric unit comprises positioning a thermally controlled plate at least proximate the second side of the thermoelectric unit.

5. The method of claim 4, further comprising regulating a temperature of the thermally controlled plate by flowing water through the thermally controlled plate.

6. The method of claim 1, further comprising:
monitoring a temperature of the first electrode; and
activating the thermoelectric unit based on the temperature of the first electrode.

7. The method of claim 1 wherein the thermoelectric unit comprises at least two thermoelectric elements configured to heat or cool different regions of the first electrode.

8. The method of claim 7, further comprising:
monitoring one or more temperatures of the different regions of the first electrode; and
activating at least one of the thermoelectric elements based on the temperature of the region of the corresponding thermoelectric element.

9. A method of processing a microfeature workpiece with a capacitively coupled plasma in a reactor, the method comprising:
heating a first electrode with a thermoelectric unit, wherein the first electrode and the thermoelectric unit are disposed in an upper portion of the reactor in fluid communication with a lower portion of the reactor,
wherein the first electrode includes a front side opposite a back side, wherein the thermoelectric unit has a first surface opposite a second surface;
wherein the first surface is exposed to the upper portion of the reactor; and
wherein the second surface is positioned in direct contact with the backside of the first electrode;
producing a plasma in the reactor between the first electrode and a second electrode in the lower portion; and
maintaining a desired temperature of the first electrode during the plasma production by cooling and heating the first electrode with the thermoelectric unit at different times,
wherein the first surface of the thermoelectric unit is configured to heat the upper portion when the second surface of the thermoelectric unit cools the backside of the first electrode; and
wherein the first surface of the thermoelectric unit is configured to cool the upper portion when the second surface of the thermoelectric unit heats the backside of the first electrode.

10. The method of claim 9 wherein:
heating the first electrode with the thermoelectric unit comprises applying a first voltage having a first polarity to the thermoelectric unit; and
cooling the first electrode with the thermoelectric unit comprises applying a second voltage having a second polarity opposite from the first polarity to the thermoelectric unit.

11. The method of claim 9 wherein the thermoelectric unit comprises at least two thermoelectric elements.

12. The method of claim 11, further comprising:
monitoring a temperature of different regions of the first electrode; and
operating one or more of the at least two thermoelectric elements according to the temperatures of the different regions.

13. A method of processing a semiconductor wafer with a capacitively coupling plasma in a reactor, the method comprising:
applying a first voltage at a first polarity to a thermoelectric unit, wherein the thermoelectric unit has a first surface opposite a second surface positioned proximate a backside of a first electrode in an upper portion of the reactor, and wherein at the first polarity, the second surface of the thermoelectric unit is configured to heat the first electrode and the first surface is configured to cool the upper portion of the reactor;
producing a plasma in the reactor between the first electrode and a second electrode positioned at least proximate the wafer; and
maintaining a desired temperature of the first electrode during the plasma production by applying a second voltage at a second polarity opposite the first polarity to the thermoelectric unit, wherein at the second polarity, the second surface is configured to cool the first electrode and the first surface is configured to heat the upper portion of the reactor.

14. The method of claim 13 wherein the thermoelectric unit comprises a Peltier unit.

15. The method of claim 13 wherein the second surface of the thermoelectric unit contacts the backside of the first electrode.

16. The method of claim 15 wherein the thermoelectric unit heats and cools the first electrode by conduction.

17. The method of claim 13, further comprising heating and cooling the thermoelectric unit with a temperature controlled plate positioned at least proximate the first surface.

18. The method of claim 17 wherein heating and cooling the thermoelectric unit with the temperature controlled plate comprises flowing water through the temperature controlled plate.

19. The method of claim 18, further comprising flowing water at a generally constant temperature.

20. The method of claim 19 wherein the generally constant temperature comprises room temperature.

21. The method of claim 13, further comprising monitoring a temperature of the first electrode and selectively operating the thermoelectric unit based on the temperature of the first electrode.

22. The method of claim 13 wherein the thermoelectric unit comprises at least two thermoelectric elements corresponding to different regions of the first electrode.

23. The method of claim 22, further comprising monitoring a temperature of the different regions of the first electrode and selectively operating the thermoelectric elements based on the temperature of the different regions of the first electrode.

24. A method of processing a semiconductor workpiece in a reactor, the method comprising:
operating a thermoelectric unit disposed in an upper portion of the reactor at a first voltage, the thermoelectric unit having a first surface opposite a second surface in thermal communication with a first electrode disposed in the upper portion of the reactor, wherein operating the thermoelectric unit at the first voltage includes—
heating the first electrode by direct conduction via the second surface of the thermoelectric unit; and
absorbing heat from the upper portion of the reactor via the first surface of the thermoelectric unit;

ionizing one or more process gases distributed in a processing chamber between the first electrode and a second electrode disposed at least proximate the workpiece in the processing chamber;

monitoring a temperature of the first electrode during the process gas ionization; and operating the thermoelectric unit at a second voltage when the temperature of the first electrode exceeds a predetermined desired temperature, wherein operating the thermoelectric unit at the second voltage includes— absorbing heat from the first electrode by direct conduction via the second surface of the thermoelectric unit; and emitting heat from the first surface of the thermoelectric unit into the upper portion of the reactor.

25. The method of claim 24, further comprising operating the thermoelectric unit at the first voltage when the temperature is less than the desired temperature.

26. The method of claim 24, further comprising maintaining the desired temperature of the first electrode during process gas ionization by selectively operating the thermoelectric unit at the first and second voltages.

27. The method of claim 24 wherein:

operating the thermoelectric unit at the first voltage comprises applying the first voltage to the thermoelectric unit with a first polarity; and operating the thermoelectric unit at the second voltage comprises applying the second voltage to the thermoelectric unit with a second polarity opposite the first polarity.

28. The method of claim 24, further comprising flowing a cooling or heating medium through a thermal control unit disposed in the upper portion of the reactor and spaced apart from the first surface of the thermoelectric unit.

* * * * *

UNITED STATES PATENT AND TRADEMARK OFFICE
CERTIFICATE OF CORRECTION

PATENT NO.       : 8,910,591 B2                                Page 1 of 1
APPLICATION NO.  : 13/767526
DATED            : December 16, 2014
INVENTOR(S)      : Mark Kiehlbauch It is certified that error appears in the above-identified patent and that said Letters Patent is hereby corrected as shown below:

In the Claims

In column 10, line 48, in Claim 1, delete "wafer, and" and insert -- wafer; and --, therefor.

Signed and Sealed this
Twenty-fourth Day of March, 2015

Michelle K. Lee
*Director of the United States Patent and Trademark Office*